United States Patent
Stakely et al.

(10) Patent No.: US 8,154,322 B2
(45) Date of Patent: Apr. 10, 2012

(54) APPARATUS AND METHOD FOR HDMI TRANSMISSION

(75) Inventors: Barry Stakely, Snow Camp, NC (US); Gan Guo, Shanghai (CN); Jiefeng Yan, Shanghai (CN)

(73) Assignee: Analog Devices, Inc., Norwood, MA (US)

( * ) Notice: Subject to any disclaimer, the term of this patent is extended or adjusted under 35 U.S.C. 154(b) by 43 days.

(21) Appl. No.: 12/643,805

(22) Filed: Dec. 21, 2009

(65) Prior Publication Data

US 2011/0148504 A1   Jun. 23, 2011

(51) Int. Cl.
   *H03B 1/00*   (2006.01)

(52) U.S. Cl. .......................................... 327/108; 326/82

(58) Field of Classification Search .................. 327/108, 327/109, 111, 112; 326/82, 83, 88
   See application file for complete search history.

(56) References Cited

U.S. PATENT DOCUMENTS

| | | | |
|---|---|---|---|
| 3,506,851 A * | 4/1970 | Dierking et al. ................ 326/88 |
| RE27,305 E * | 3/1972 | Polkinghorn et al. .......... 326/88 |
| 3,835,457 A * | 9/1974 | Yu ................................... 326/70 |
| 3,898,479 A * | 8/1975 | Proebsting ..................... 326/88 |
| 4,443,715 A * | 4/1984 | Fox ................................. 326/88 |
| 4,500,799 A * | 2/1985 | Sud et al. ....................... 326/107 |
| 4,649,300 A | 3/1987 | Schutz |
| 4,689,505 A * | 8/1987 | Ghoshal .......................... 326/88 |
| 4,725,746 A | 2/1988 | Segawa et al. |
| 5,111,064 A * | 5/1992 | Ward ............................. 327/108 |
| 5,469,094 A * | 11/1995 | Nessi ............................. 327/110 |
| 6,072,354 A * | 6/2000 | Tachibana et al. ............. 327/390 |
| 6,236,239 B1 * | 5/2001 | Kogushi .......................... 326/88 |
| 6,320,432 B1 * | 11/2001 | Nagao ............................ 327/108 |
| 6,788,108 B2 * | 9/2004 | Miyake et al. .................. 326/88 |
| 6,850,100 B2 * | 2/2005 | Takeshita ...................... 327/112 |
| 6,873,507 B2 | 3/2005 | Roohparvar |
| 6,975,142 B2 * | 12/2005 | Azami et al. ................... 326/88 |
| 7,228,154 B2 | 6/2007 | Champion et al. |

(Continued)

FOREIGN PATENT DOCUMENTS

EP   1253718   10/2002

(Continued)

OTHER PUBLICATIONS

Analog Devices, "High Performance, Low Power HDMI/DVI Transmitter AD9387NK,"Oct. 2007.

(Continued)

*Primary Examiner* — Lincoln Donovan
*Assistant Examiner* — William Hernandez
(74) *Attorney, Agent, or Firm* — Knobbe, Martens, Olson & Bear LLP

(57) ABSTRACT

Apparatus and methods are disclosed, such as those involving a high frequency transmitter. One such apparatus includes a pre-amplifier configured to receive an input signal via an input node; and a capacitor block electrically coupled between the pre-amplifier and an output node from which an output signal is transmitted. The capacitor block is configured to provide charge to the output node or pull charge from the output node while the output signal transitions. The apparatus further includes a switch electrically coupled between the output node and a voltage reference, wherein the switch is turned on or off at least partly in response to a signal from the pre-amplifier. This configuration effectively reduces rise and fall time of the output signal for high-frequency transmission.

27 Claims, 8 Drawing Sheets

U.S. PATENT DOCUMENTS

Figure 1:
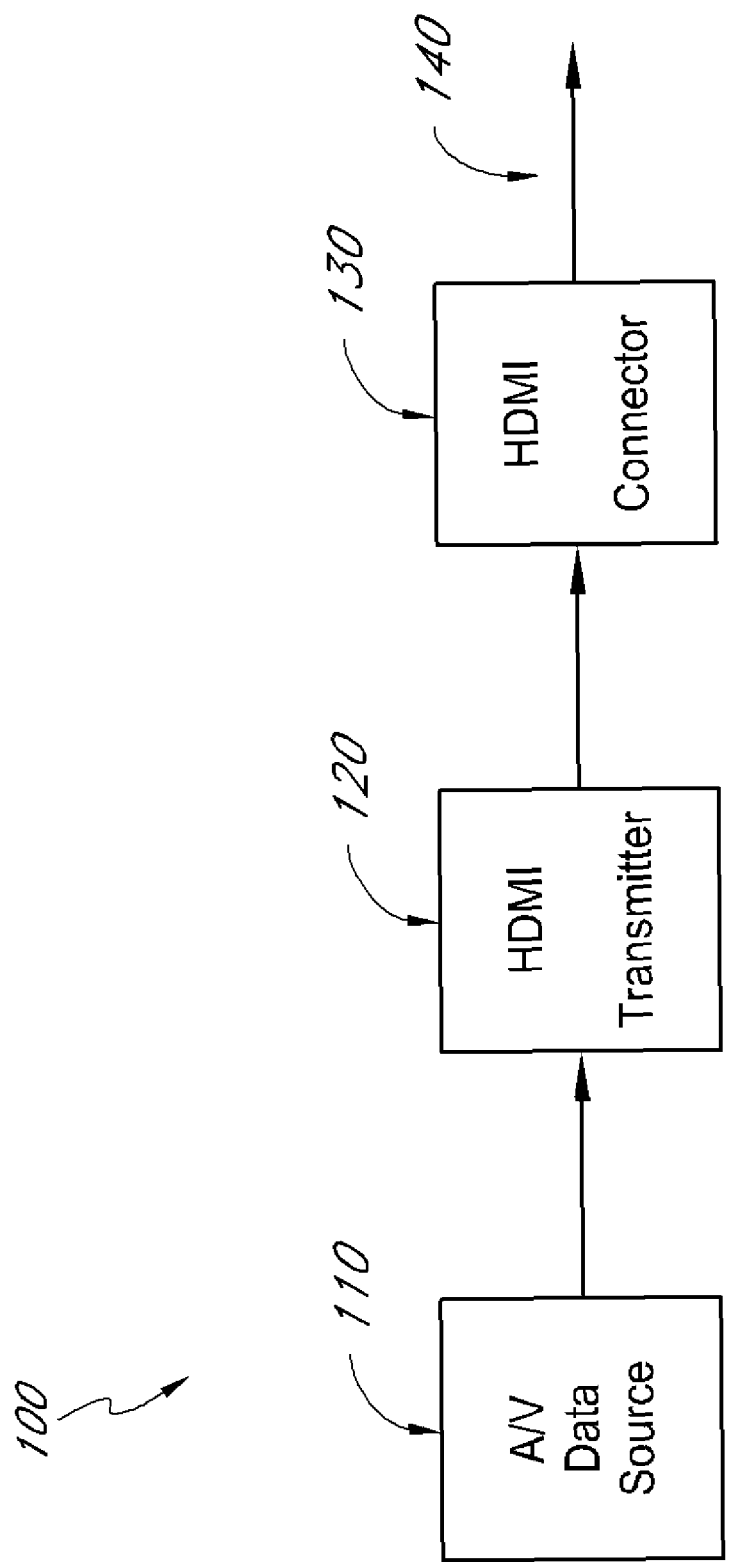

| | | | |
|---|---|---|---|
| 7,259,521 B1 * | 8/2007 | Ritter | 315/169.1 |
| 7,420,395 B2 * | 9/2008 | Kuramasu | 326/83 |
| 7,521,975 B2 * | 4/2009 | Biesterfeldt et al. | 327/170 |
| 7,586,478 B2 * | 9/2009 | Azami et al. | 345/100 |
| 7,649,384 B2 * | 1/2010 | Ho et al. | 326/83 |
| 7,903,079 B2 * | 3/2011 | Azami et al. | 345/100 |
| 2008/0239082 A1 | 10/2008 | Zhu et al. | |
| 2010/0253394 A1 * | 10/2010 | Tran | 327/108 |
| 2010/0283768 A1 * | 11/2010 | Weng et al. | 345/204 |
| 2011/0279438 A1 * | 11/2011 | Ito | 345/212 |

FOREIGN PATENT DOCUMENTS

WO    WO 2008/052607    5/2008

OTHER PUBLICATIONS

Analog Devices, "225 MHz, High Performance HDMI Transmitter With ARC ADV7511," 2010.

Analog Devices, "High Performance HDMI/DVI Transmitter: AD9389B," 2007.

Analog Devices, "High Performance HDMI/DVI Transmitter: AD9889," 2005.

Analog Devices, "High Performance HDMI/DVI Transmitter: AD9889B," 2007.

Analog Devices, "ADV7510: Deep Color HDMI 1.3 Transmitter with CEC," 2008.

Analog Devices, Low Power HDMI/DVI Transmitter with Consumer Electronic Control (CEC): ADV7520, 2008.

Analog Devices, Low Power HDMI/DVI Transmitter with Consumer Electronic Control (CEC): ADV7520NK, 2008.

Analogix Semiconductor, "Product Brief ANX9301: HDMI Transmitter," Rev. 0.11, 2006.

High-Definition Multimedia Interface Specification Version 1.3, Jun. 22, 2006.

Pillai, Latha, "Color Space Converter," Xilinx XAPP283 (v1.1), Apr. 22, 2001.

International Search Report and Written Opinion received in International Appl. No. PCT/US2010/059751, dated Mar. 2, 2011.

\* cited by examiner

APPARATUS AND METHOD FOR HDMI TRANSMISSION

BACKGROUND

1. Field

Embodiments of the invention relate to electronic devices, and more particularly, in one or more embodiments, to transmitters for high frequency data transmission.

2. Description of the Related Technology

Recently, many electronic systems have employed a high frequency (for example, a frequency higher than 1 GHz) for data transmission. For example, certain electronic systems used for transmitting audio/video (A/V) data employ a high frequency to transmit a large volume of data. Such electronic systems can be designed to be in compliance with a certain standard, such as the High-Definition Multimedia Interface (HDMI) standard.

Such electronic systems can include a transmitter for transmitting data signals at a selected frequency. The transmitter can change the level and/or format of the signals to be suitable for transmission over a medium, such as a cable or wireless medium. In some examples, a transmitter can include a driver circuit to boost the voltage level of data signals to a selected voltage level for transmission over a medium. Because such a driver circuit of a high frequency transmitter needs to operate at a high frequency, it may have physical constraints that a lower frequency driver circuit would not have. Thus, there is a need for providing a circuit design adapted for a high frequency driver circuit.

SUMMARY

In one embodiment, an apparatus includes: an input node; an output node; an explicit capacitor block having a first terminal coupled to the output node; a first switch operatively coupled to the output node, the first switch being capable of switching at least one of high or low in response to conditions at the input node; and an inverter or buffer circuit having an output capacitively coupled to the output node via the explicit capacitor block. The output of the inverter or buffer circuit is configured to switch high and low in response to the conditions at the input node. The output of the inverter or buffer circuit is substantially in phase with the output of the first switch.

In another embodiment, an electronic device includes: a driver circuit coupled between an input node and an output node. The driver circuit includes: an inverter having an inverter input and an inverter output, the inverter input being configured to receive a data or clock signal via the input node; a buffer having a buffer input and a buffer output, the buffer input being configured to receive the data or clock signal via the input node; a capacitor block having a first terminal and a second terminal, the first terminal being electrically coupled to the output node, the second terminal being electrically coupled to the inverter output; a parasitic capacitor coupled between the output node and ground; and a transistor electrically coupled between the output node and a voltage reference, the transistor being configured to receive a signal from the buffer output.

In yet another embodiment, a method of driving an output signal includes: driving at least one of a first state or a second state of the output signal with a direct current drive; and driving transitions of the output signal with a capacitively-coupled drive in parallel with the direct current drive.

BRIEF DESCRIPTION OF THE DRAWINGS

FIG. 1 is a block diagram illustrating an electronic system for transmitting A/V data according to one embodiment.

FIG. 2 is a block diagram illustrating one embodiment of the HDMI transmitter of FIG. 1.

FIG. 3 is a circuit diagram of one embodiment of a driver circuit of the HDMI transmitter of FIG. 2 for single-ended signaling.

FIG. 4A is a schematic cross-section of one embodiment of the capacitor block of FIG. 3, including a metal-insulator-metal capacitor.

FIG. 4B is a circuit diagram of another embodiment of the capacitor block of FIG. 3, including PMOS transistors coupled in parallel.

FIG. 4C is a circuit diagram of yet another embodiment of the capacitor block of FIG. 3, including NMOS transistors coupled in parallel.

FIG. 4D is a schematic cross-section of yet another embodiment of the capacitor block of FIG. 3, including an n-well capacitor.

FIG. 5 is a timing diagram illustrating the operation of the driver circuit of FIG. 3.

FIG. 6 is a circuit diagram of another embodiment of a driver circuit of an HDMI transmitter for single-ended signaling.

FIG. 7 is a circuit diagram of yet another embodiment of a driver circuit of an HDMI transmitter for single-ended signaling.

FIG. 8 is a circuit diagram of yet another embodiment of a driver circuit of an HDMI transmitter for differential signaling.

DETAILED DESCRIPTION OF EMBODIMENTS

The following detailed description of certain embodiments presents various descriptions of specific embodiments of the invention. However, the invention can be embodied in a multitude of different ways as defined and covered by the claims. In this description, reference is made to the drawings where like reference numerals indicate identical or functionally similar elements.

Overview of A/V Data Transmission System

Referring to FIG. 1, a system for transmitting data according to one embodiment will be described below. The illustrated system 100 is configured to provide audio/video (A/V) data to a sink device (for example, a display device) via a wired connection. The A/V data can be digital data. The illustrated system 100 includes an A/V data source 110, a transmitter 120, and a connector 130.

The A/V data source 110 serves to provide A/V data to be transmitted by the system 100. In one embodiment, the A/V data source 110 can at least temporarily store A/V data and provide the A/V data to the transmitter 120. In other embodiments, the A/V data source 110 can simply relay A/V data from another source to the transmitter 120 without storing the A/V data. Examples of the A/V data source 110 include, but are not limited to, at least part of a DVD player or other optical disc player, such as a Blu-Ray player, a laptop computer, a desktop computer, a hand-held computer, a netbook computer, a server, a satellite receiver, a broadcast receiver, a set-top box or cable receiver, a video conferencing system, a video game console, an A/V receiver, a cellular phone, a smart phone, a personal digital assistant (PDA), an MP3 player, such as IPOD®, a camcorder, a digital camera, a digital video recorder (DVR), a portable memory chip, or the like.

The transmitter 120 serves to process the A/V data to have a selected voltage level, and to provide the A/V data to the connector 130. In the illustrated embodiment, the transmitter 120 is configured to process A/V data to be in compliance with the High Definition Multimedia Interface (HDMI) protocol, including the HDMI 1.0 to 1.4 specifications. Thus, in such an embodiment, the illustrated transmitter 120 can be referred to as an "HDMI transmitter." The HDMI transmitter 120 processes A/V data, using HDMI protocols, by, for example, encrypting the data using High-Bandwidth Digital Content Protection (HDCP) and supporting display resolution.

The connector 130 serves to provide electrical connection between the HDMI transmitter 120 and an end of an external cable or wire 140. The other end of the external cable 140 can be connected to, for example, a Digital Visual Interface (DVI) receiver that receives A/V data for a sink device, such as a television. In the illustrated embodiment, the connector 130 is used with the HDMI transmitter 120, and thus has pins dedicated for providing signals according to the HDMI protocol. A skilled artisan will appreciate that various forms of connectors, including Types A to D connectors, can serve as an HDMI connector. Other details of the HDMI connector 130 are disclosed in the HDMI specifications, including the HDMI 1.0 to 1.4 specifications.

In some embodiments, one or more of the transmitter 120 and the connector 130 can be integrated with the A/V data source 110 within a single housing. For example, the A/V data source 110, the transmitter 120, and the connector 130 can be part of a DVD player. In such embodiments, part (for example, pins) of the connector 130 can be exposed to the outside of the housing for connection with an external cable.

In another embodiment, a system can include an A/V data source, an HDMI transmitter, and a wireless module. The HDMI transmitter serves to process and relay A/V data from the A/V data source to the wireless module. The wireless module can wirelessly transmit the data to a sink device over a wireless medium.

While illustrated in the context of A/V data transmitted by an HDMI transmitter, the principles and advantages described herein are applicable to various types of digital data and to any suitable transmitter, and where wired connections are used, to connectors other than HDMI connectors.

Figure 2:
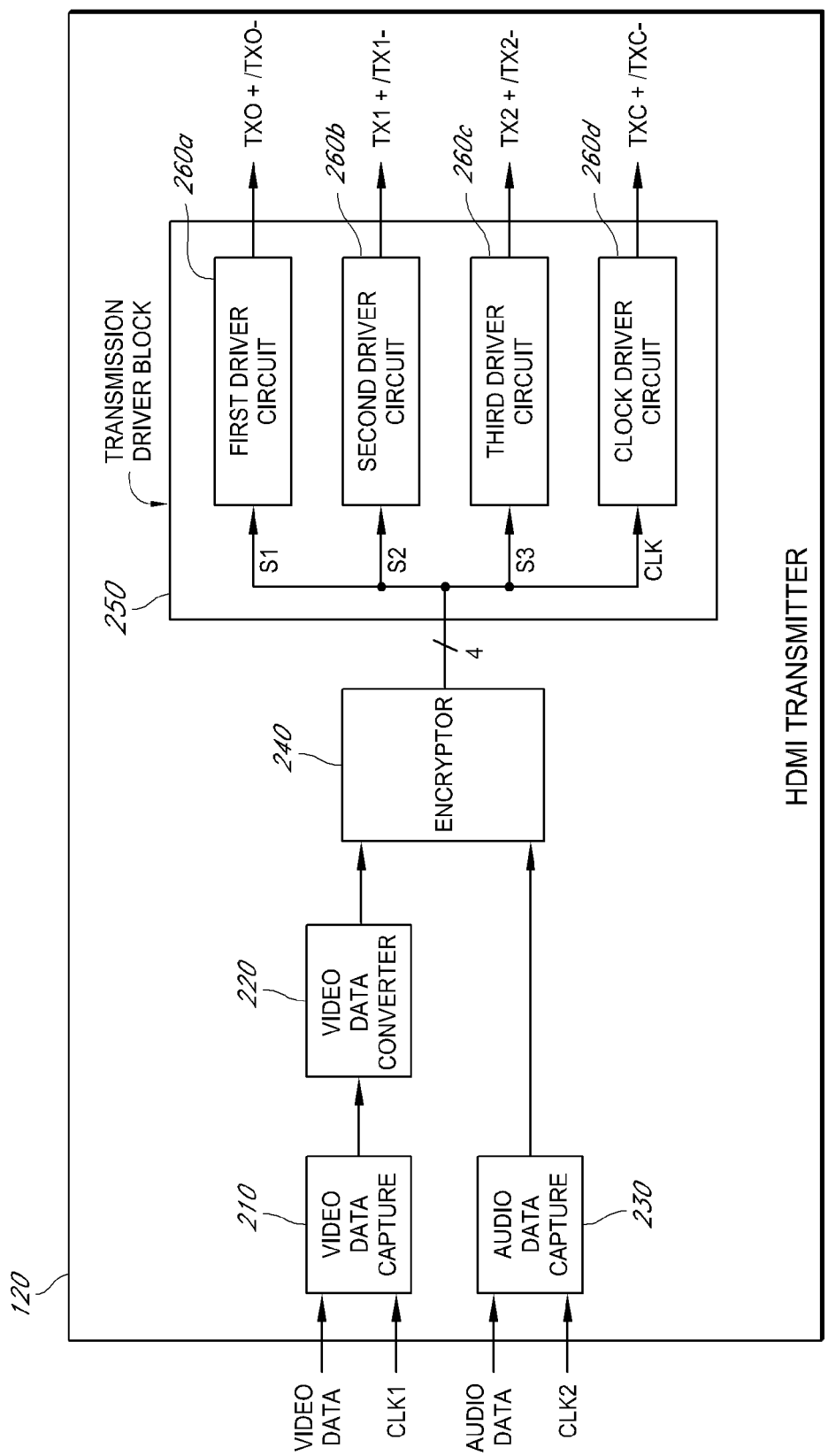

Referring to FIG. 2, one embodiment of the HDMI transmitter 120 will be described below. The illustrated HDMI transmitter 120 includes a video data capture module 210, a video data converter 220, an audio data capture module 230, an encryptor 240, and a transmission driver block 250.

The video data capture module 210 serves to receive video data and a first clock signal CLK1 from the A/V data source 110, and to buffer the video data. Then, the video data capture module 210 provides the buffered video data to the video data converter 220.

The video data converter 220 serves to convert the video data from one color format to another color format when applicable. For example, the video data converter 220 can convert sub-sampled 4:2:2 data to fully sampled 4:4:4 data, from YUV color space to RGB color space, etc. The video data converter 220 may also be referred to as a "color space converter." The video data converter 220 provides the converted video data to the encryptor 240.

The audio data capture module 230 serves to receive audio data and a second clock signal CLK2 from the A/V data source 110, and to buffer the audio data. Then, the audio data capture module 230 provides the buffered audio data to the encryptor 240.

The encryptor 240 serves to encrypt the video data from the video data converter 220 and the audio data from the audio data capture module 230, using High-Bandwidth Digital Content Protection (HDCP), and to generate encrypted A/V data. The HDCP is intended to prevent copying of digital audio and video content as it travels across an HDMI connection. The encrypted A/V data can include first to third data signals S1-S3 and a clock signal CLK. The first to third data signals S1-S3 can include video components for red (R), green (G), and blue (B), respectively, of the video data. One or more of the first to third data signals S1-S3 can also include an audio component representing at least part of the audio data.

The transmission driver block 250 serves to receive the encrypted A/V data (the first to third data signals S1-S3 and the clock signal CLK), and to drive the signals S1-S3 and CLK to have a signal level in compliance with the HDMI protocol. Under the HDMI protocol, data and clock signals swing between about 2.8V and about 3.3V (+/−20% variation) for single-ended signaling, and between about −500 mV and about +500 mV for differential signaling. The required operating conditions for HDMI interface includes a termination supply voltage at an HDMI transmitter of 3.3 V (±5%), and a termination resistance at an HDMI transmitter of 50 ohms (±10%).

The illustrated transmission driver block 250 includes first to third driver circuits 260a-260c, and a clock driver circuit 260d. The first to third driver circuits 260a-260c receive the first to third data signals S1-S3, respectively, and generate differential signals TX0+/TX0−, TX1+/TX1−, and TX2+/TX2−, respectively. The clock driver circuit 260d receives the clock signal CLK, and generates differential clock signals TXC+/TXC−.

The driver circuits 260a-260d can change the voltage levels of the output signals (for example, the differential signals TX0+/TX0−, TX1+/TX1−, TX2+/TX2−, TXC+/TXC−) to either high or low in response to the digital signals S1-S3, CLK. During the transitions of the output signals, the rise and fall time of the output signals are determined by the amount of charge/discharge current into and out of parasitic capacitors at the output nodes of the driver circuits 260a-260d.

For data bit rates of above 1.6 GHz, a rise time of about 160 picoseconds (psec) results in a very small eye opening. For example, at a data bit rate of 2.2 GHz (for transmission of video data with 1080p deep color), there is only about 30 psec to 40 psec of margin before the output signal fails the compliance test mask of the HDMI specification. Such a small margin places significant constraints on design of a high frequency transmitter, for example, an HDMI transmitter. At a data bit rate of, for example, about 3.7 GHz, a conventional HDMI transmitter fails the compliance test even under optimal conditions. Therefore, there is a need for a driver circuit that has reduced rise and/or fall times of its output signals for high frequency operation.

Driver Circuit for High Frequency Transmitter

In some embodiments, a driver circuit for a high frequency transmitter can include a capacitor block that injects charge into a parasitic capacitor at the output of the driver circuit when an output signal of the driver circuit rises. The capacitor block can also pull charge from the parasitic capacitor when the output signal falls. By injecting and pulling charge, the parasitic capacitor can be charged and discharged faster than without the capacitor block. Thus, the output signal can have significantly reduced rise and fall time. In some embodiments, such a driver circuit can provide a faster rise or fall time where only a passive pull-up or pull-down is available, for example, in a chip for an HDMI transmitter with about 1.8V supply with a resistive termination to about 3.3V.

Figure 3:
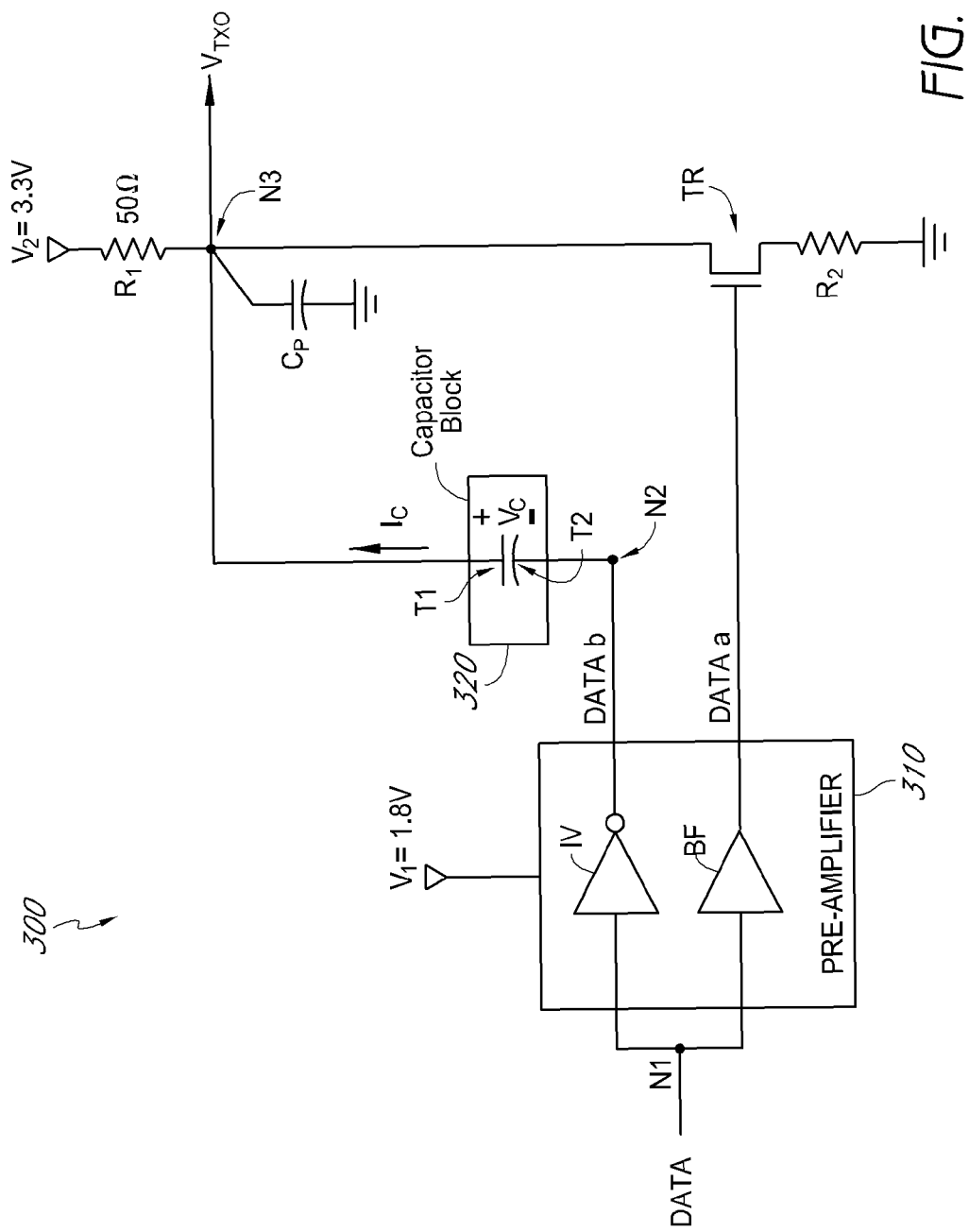

Referring to FIG. 3, a driver circuit for a high frequency transmitter according to one embodiment will be described below. The illustrated driver circuit is for a wired, not wireless, application. However, it can be adapted for a wireless application. In one embodiment, the driver circuit 300 can be used for a driver circuit in the HDMI transmitter 120 of FIG.

2. The illustrated driver circuit 300 can form at least part of any of the first to third driver circuits 260a-260c and the clock driver circuit 260d. The driver circuit 300 can be used for an HDMI transmitter employing single-ended signaling. The driver circuit 300 includes a pre-amplifier 310, a capacitor block 320, a transistor TR, first and second resistors R1, R2, a parasitic capacitor Cp, and first to third nodes N1-N3.

The pre-amplifier 310 includes an inverter IV and a buffer BF. The inverter IV includes an input coupled to an output of the encryptor 240 (FIG. 2) via the first node N1, and an output coupled to the second node N2. The inverter IV serves to receive an encrypted data signal DATA from the encryptor 240, and generate an inverted data signal DATAb in response to the encrypted data signal DATA. The inverter IV can have a selected drive strength for charging the capacitor block 320. The drive strength of the inverter IV can be selected to provide charge injection of between about 0% and about 100% to the capacitor block 320. During the design phase, the maximum drive strength is set by the expected worst case conditions, including a poor board layout which will increase the parasitic load capacitance. The actual drive strength of the circuit during normal operation can be set either by hardware or software based on the parasitics of a specific board layout and the output bit rate. A good board layout may require a drive strength of 25% to 50% for the maximum bit rate while a poor board layout may require 100% charge injection. For low frequency data rates, the charge injection can be set to zero.

The buffer BF includes an input coupled to the output of the encryptor 240 (FIG. 2) via the first node N1, and an output coupled to the transistor TR. The buffer BF serves to receive the encrypted data signal DATA from the encryptor 240, and generate a buffered data signal DATAa in response to the encrypted data signal DATA.

The pre-amplifier 310 is also coupled to a first voltage source V1. The first voltage source V1 can supply a first voltage ranging from about 1.6 V to about 2.0 V, for example, +1.8V.

The capacitor block 320 includes a first terminal T1 coupled to the third node N3, and a second terminal T2 coupled to the second node N2. In one embodiment, the capacitor block 320 can have a capacitance between about 1 pF and about 5 pF, and optionally between about 1.5 pF and about 2.5 pF, for example, about 2 pF.

The capacitor block 320 is charged or discharged, depending on a voltage difference between the third and second nodes N3, N2 (or between the first and second terminals T1, T2). The capacitor block 320 injects charge into the parasitic capacitor Cp when discharging, and pulls charge from the parasitic capacitor when charging. In the context of this document, a voltage difference between the first and second terminals ($V_{T1}-V_{T2}$) can be referred to as a capacitor voltage Vc. In addition, a current flowing from the first terminal T1 can be referred to as a capacitor current Ic, as denoted in FIG. 3. Other details of the capacitor block 320 will be described later in connection with FIGS. 4A-4D.

The transistor TR is coupled between the third node N3 and the second resistor R2. The transistor TR serves as a switch responding to the buffered data signal DATAa. In the illustrated embodiment, the transistor TR is an n-type metal-oxide-semiconductor field effect transistor (MOSFET). In another embodiment, the transistor TR can be a p-type MOSFET, depending on the configuration of the circuit. The transistor TR has a source/drain coupled to the third node N3, a drain/source coupled to the second resistor R2, and a gate coupled to the output of the buffer BF.

The first resistor R1 is coupled between a second voltage source V2 and the third node N3. The first resistor R1 can have a resistance between about 25 ohms and about 100,000 ohms. The second voltage source V2 can supply a second voltage greater than the first voltage supplied by the first voltage source V1. The second voltage can range from about +1.8 V to about +100 V. In the illustrated embodiment where the circuit 300 is used for an HDMI transmitter, the first resistor R1 and the second voltage source V2 may be external to the circuit 300, and coupled to the circuit 300 via the third node N3. According to the HDMI specification, the second voltage supply can have a voltage of +3.3 V (±5%), and the first resistor R1 can have a resistance of 50 ohms (±10%). A skilled artisan will appreciate that the numerical ranges provided above are only exemplary, and can vary widely, depending on chip technology and transmitter application.

The second resistor R2 is coupled between the drain/source of the transistor TR and ground. The second resistor R2 can have a resistance between about 0 ohms and about 10,000 ohms, for example, 50 ohms.

The parasitic capacitor Cp is an unavoidably formed capacitor between devices and interconnects of the circuit 300, as a result of the proximity of the devices and interconnects. In the illustrated embodiment, the parasitic capacitor Cp exists between the third node N3 and a DC reference, such as ground. In one embodiment, the parasitic capacitor Cp can have a capacitance between about 2 pF and about 3 pF. The third node N3 is a node from which an output data signal $V_{TXO}$ is outputted to the connector 130 (FIG. 1). In an alternative embodiment, the buffer BF and the inverter IV of the pre-amplifier 310 are interchanged.

Figure 4A:
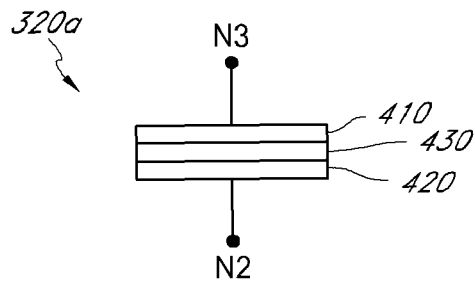

Referring to FIGS. 4A-4D, some embodiments of the capacitor block 320 of FIG. 3 will be described below. The capacitor block 320 is an explicit capacitance and is not merely a parasitic capacitance. In one embodiment, a capacitor block 320a can include a metal-insulator-metal (MIM) capacitor, as shown in FIG. 4A. The illustrated MIM capacitor 320a includes a first metal plate 410, a second metal plate 420, and a dielectric layer 430 interposed between the first and second metal plates 410, 420. The first metal plate 410 serves as a first terminal, and is electrically coupled to the third node N3 of the circuit 300 of FIG. 3. The second metal plate 420 serves as a second terminal, and is electrically coupled to the second node N2 of the circuit 300 of FIG. 3. A skilled artisan will appreciate that various configurations of MIM capacitors can be used for the capacitor block 320a.

Figure 4B:
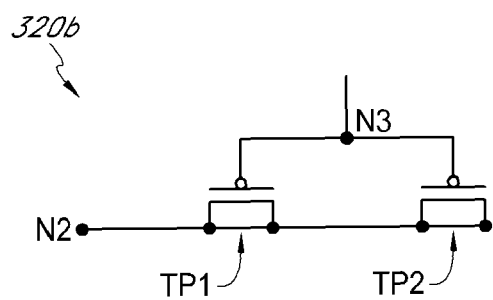

Referring to FIG. 4B, another embodiment of the capacitor block 320 of FIG. 3 can include a plurality of p-type metal-oxide-semiconductor (PMOS) transistors coupled in parallel. In the illustrated embodiment, a capacitor block 320b includes a first PMOS transistor TP1 and a second PMOS transistor TP2. The first PMOS transistor TP1 has a source/drain coupled to the second node N2, a drain/source coupled to the second node N2, and a gate coupled to the third node N3. The second PMOS transistor TP2 has a source/drain coupled to the second node N2, a drain/source coupled to the second node N2, and a gate coupled to the third node N3. The gates of the first and second PMOS transistors TP1, TP2 together serve as a first terminal of the capacitor block 320b. The sources/drains and drains/sources of the first and second PMOS transistors TP1, TP2 together serve as a second terminal of the capacitor block 320b. In another embodiment, one of the PMOS transistors TP1, TP2 can be omitted. In other embodiments, one or more additional PMOS transistors can be coupled in parallel to the first and second PMOS transistors TP1, TP2. The number of PMOS transistors coupled in parallel can vary widely, depending on the capacitance selected for the capacitor block 320b and the sizes of the PMOS transistors. In certain embodiments, the number of PMOS transistors coupled in parallel can be between 2 and 100, for example, 20.

Figure 4C:
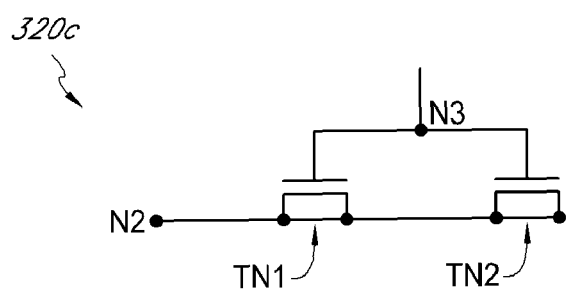

Referring to FIG. 4C, yet another embodiment of the capacitor block 320 of FIG. 3 can include a plurality of n-type metal-oxide-semiconductor (NMOS) transistors coupled in parallel. In the illustrated embodiment, a capacitor block 320c includes a first NMOS transistor TN1 and a second NMOS transistor TN2. The first NMOS transistor TN1 has a source/drain coupled to the second node N2, a drain/source coupled to the second node N2, and a gate coupled to the third node N3. The second NMOS transistor TN2 has a source/drain coupled to the second node N2, a drain/source coupled to the second node N2, and a gate coupled to the third node N3. The gates of the first and second NMOS transistors TN1, TN2 together serve as a first terminal of the capacitor block 320c. The sources/drains and drains/sources of the first and second NMOS transistors TN1, TN2 together serve as a second terminal of the capacitor block 320c. In another embodiment, one of the NMOS transistors TN1, TN2 can be omitted. In other embodiments, one or more additional NMOS transistors can be coupled in parallel to the first and second NMOS transistors TN1, TN2. The number of NMOS transistors coupled in parallel can vary widely, depending on the capacitance selected for the capacitor block 320c and the sizes of the NMOS transistors. In certain embodiments, the number of NMOS transistors coupled in parallel can be between 2 and 100, for example, 20.

Figure 4D:
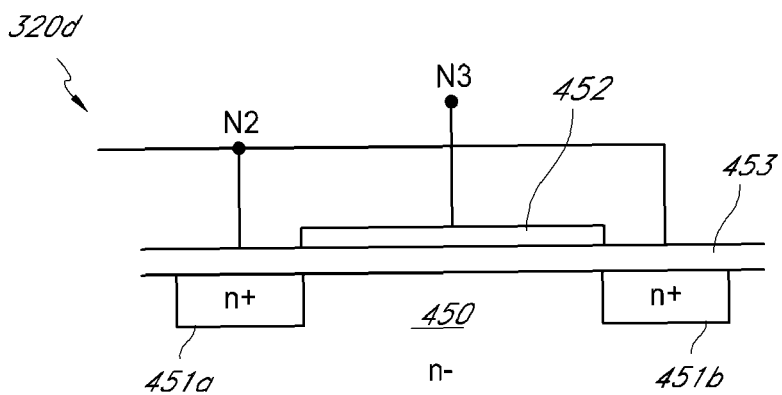

Referring to FIG. 4D, yet another embodiment of the capacitor block 320 of FIG. 3 can include one or more n-well capacitor. In the illustrated embodiment, a capacitor block 320d includes a single n-well capacitor which includes a bulk region 450 (or n− region), a first n-well region 451a (or first n+ region), a second n-well region 451b (or second n+ region), a gate 452, and an insulating layer 453.

The bulk region 450 is part of a substrate in which the driver circuit 300 of FIG. 3 is formed, and is lightly doped with an n-type dopant from chemical group III, for example, phosphorus (P), arsenic (As), or antimony (Sb). The first and second n-well regions 451a, 451b are formed in the bulk region 450, while at least a portion of the top surface of each of the n-well regions 451a, 451b contacts the insulating layer 453. Other surfaces of each of the n-well regions 451a, 451b contact the bulk region 450. The n-well regions 451a, 451b are laterally separated from each other. Each of the n-well regions 451a, 451b is heavily doped with an n-type dopant which can be the same as or different from the dopant used for the bulk region 450.

The gate 452 is formed over a region of the bulk region 450, which is between the first and second n-well regions 451a, 451b. The insulating layer 453 is formed to cover the top surfaces of the first and second n-well regions 451a, 451b, and the bulk region 450 while insulating them from the gate 452. In the n-well capacitor 320d, the gate 452 is coupled to the third node N3 of FIG. 3, and serves as a first terminal of the capacitor block 320d. The first and second n-wells 451a, 451b are coupled to each other and to the second node N2. The first and second n-wells 451a, 451b together serve as a second terminal of the capacitor block 320d.

Operation of Driver Circuit

Figure 5:
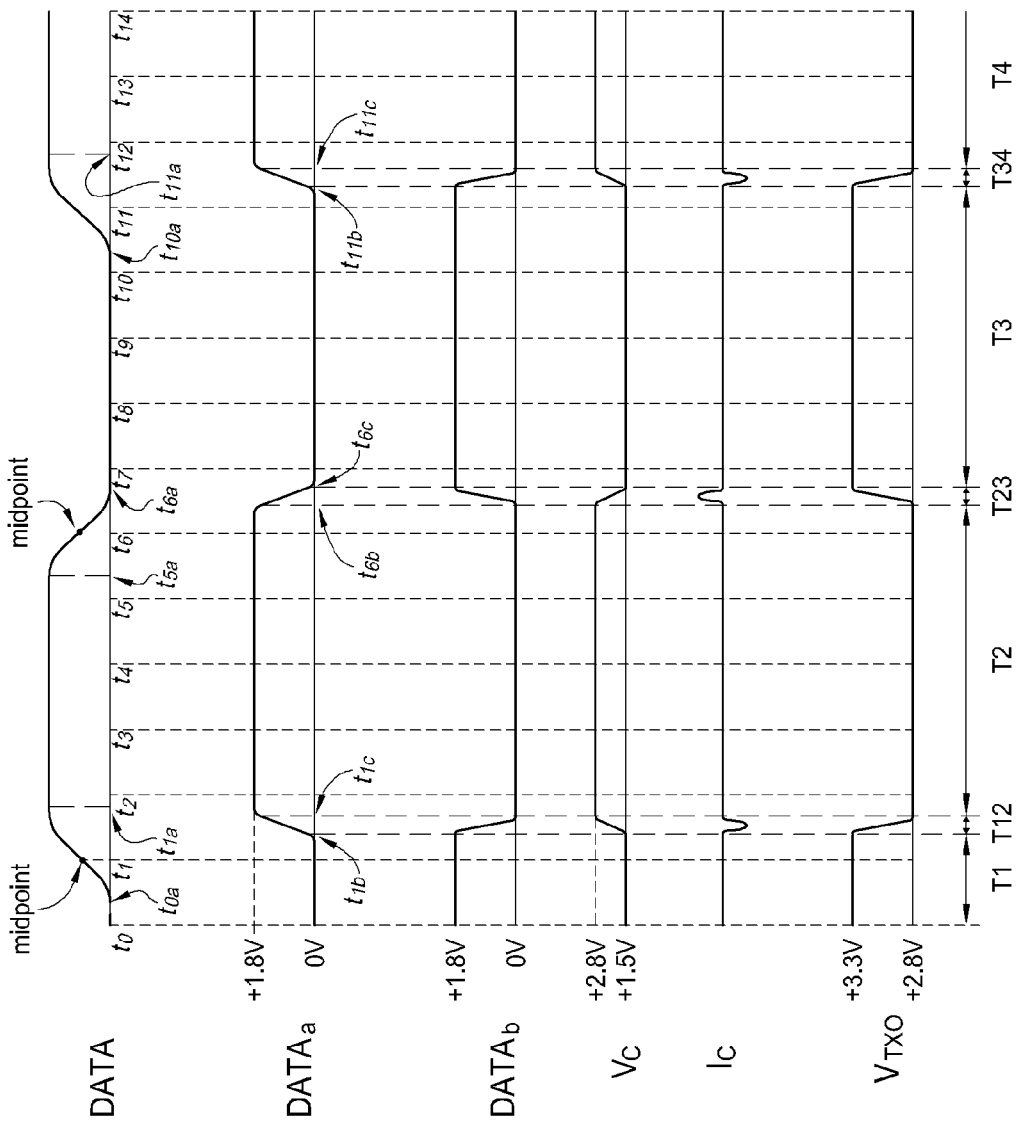

Referring to FIGS. 3 and 5, the operation of the driver circuit 300 of FIG. 3 will be described below. At t0, the data signal DATA from the encryptor 240 (FIG. 2) is low. At t0a between t0 and t1, the data signal DATA starts transitioning from low to high. The data signal DATA reaches a midpoint between low and high voltage levels at about t1, and completes transition to high at t1a between t1 and t2. In one embodiment, the data signal DATA can swing between about 0V and about +1.8V.

At t5a between t5 and t6, the data signal DATA starts transitioning from high to low. The data signal DATA reaches a midpoint between low and high voltage levels at about t6, and completes transition to low at t6a between t6 and t7. At t10a between t10 and t11, the data signal DATA starts transitioning again from low to high. The data signal DATA reaches a midpoint between low and high voltage levels at about t11, and completes transition to high at t11a between t11 and t12.

At t0, the buffered data signal DATAa outputted from the buffer BF of the pre-amplifier 310 is low. At t1b between t1 and t1a, the buffered data signal DATAa starts transitioning from low to high, and completes transition to high at t1c between t1b and t1a. The buffered data signal DATAa turns on the transistor TR (NMOS transistor in the illustrated embodiment) when the buffered data signal DATAa is high, and turns off the transistor TR when the buffered data signal DATAa is low. In one embodiment, the buffered data signal DATAa can swing between about 0V and about +1.8V. At t6b between t6 and t6a, the buffered data signal DATAa starts transitioning from high to low, and completes transition to low at t6c between t6b and t6a. At t11b between t11 and t11a, the buffered data signal DATAa starts transitioning again from low to high, and completes transition to high at t11c between t11b and t11a.

At t0, the inverted data signal DATAb outputted from the inverter IV of the pre-amplifier 310 is high. At t1b, the inverted data signal DATAb starts transitioning from high to low, and completes transition to low at t1c. In one embodiment, the inverted data signal DATAb can swing between about 0V and about +1.8V. At t6b, the inverted data signal DATAb starts transitioning from low to high, and completes transition to high at t6c. At t11b, the inverted data signal DATAb starts transitioning again from high to low, and completes transition to low at t11c.

At t0, the output data signal $V_{TX0}$ outputted from the third node N3 is high. At t1b, the output data signal $V_{TX0}$ starts transitioning from high to low, and completes transition to low at or before t1c. In one embodiment, the output data signal $V_{TX0}$ can swing between about +2.8V and about +3.3V. At t6b, the output data signal $V_{TX0}$ starts transitioning from low to high, and completes transition to high at or before t6c. At t11b, the output data signal $V_{TX0}$ starts transitioning again from high to low, and completes transition to low at or before t11c.

During a first time period T1 starting before t0 and ending at t1b, the voltage (see $V_{TX0}$) at the first terminal T1 of the capacitor block 320 is, for example, +3.3V, and the voltage (see DATAb) at the second terminal T2 of the capacitor block 320 is, for example, +1.8V. Thus, the capacitor voltage Vc is about +1.5V.

During a second time period T2 between t1c and t6b, the voltage at the first terminal T1 of the capacitor block 320 is, for example, +2.8V, and the voltage at the second terminal T2 of the capacitor block 320 is, for example, 0V. Thus, the capacitor voltage Vc is about +2.8V.

During a third time period T3 between t6c and t11b, the voltage at the first terminal T1 of the capacitor block 320 is, for example, +3.3V, and the voltage at the second terminal T2 of the capacitor block 320 is, for example, +1.8V. Thus, the capacitor voltage Vc is again about +1.5V.

During a fourth time period T3 starting at t11c and ending after t14, the voltage at the first terminal T1 of the capacitor block 320 is, for example, +2.8V, and the voltage at the second terminal T2 of the capacitor block 320 is, for example, 0V. Thus, the capacitor voltage Vc is again about +2.8V.

During a first transition period T12 between the first and second time periods T1, T2, the capacitor block 320 pulls charge from the parasitic capacitor Cp via the third node N3. Thus, a capacitor current Ic flows from the third node N3 to the capacitor block 320, resulting in a negative polarity in the capacitor current Ic. Because the capacitor block 320 has a relatively small capacitance (for example, about 2 pF), the charge transfer occurs for a very short period of time, for example, only during at least part of the first transition period T12.

During a second transition period T23 between the second and third time periods T2, T3, the capacitor block 320 injects charge into the parasitic capacitor Cp via the third node N3. Thus, a capacitor current Ic flows from the capacitor block 320 to the third node N3, resulting in a positive polarity in the capacitor current Ic. Because the capacitor block 320 has a relatively small capacitance, the charge transfer occurs for a very short period of time, for example, only during at least part of the second transition period T23.

Similarly, during a third transition period T34 between the third and fourth time periods T3, T4, the capacitor block 320 pulls charge from the parasitic capacitor Cp via the third node N3. Thus, a capacitor current Ic flows from the third node N3 to the capacitor block 320, resulting in a negative polarity in the capacitor current Ic.

The capacitor block 320 reduces the rise time of a transition of the output data signal $V_{TX0}$ by injecting charge into the parasitic capacitor Cp during the second transition period T23. In addition, the capacitor block 320 reduces the fall time of a transition of the output data signal $V_{TX0}$ by pulling charge from the parasitic capacitor Cp during the first and third transition periods T12, T34. In this manner, the capacitor block 320 reduces the rise time and the fall time of the output data signal $V_{TX0}$. The amount of charge injection and pulling can be selected during design/production by selecting the drive strength of the inverter IV and/or the size or capacitance of the capacitor block 320.

In the embodiments described above, the rise and fall time of the output data signal $V_{TX0}$ can be significantly reduced. For example, the rise and fall time can be reduced from about 160 psec (a value achievable by a driver circuit without a capacitor block) to less than about 65 psec, which is in compliance with the HDMI specification that requires a rise time of 75 psec or less, and a fall time of 0.4 $T_{bit}$ or less.

Alternative Designs of Driver Circuits

Figure 6:
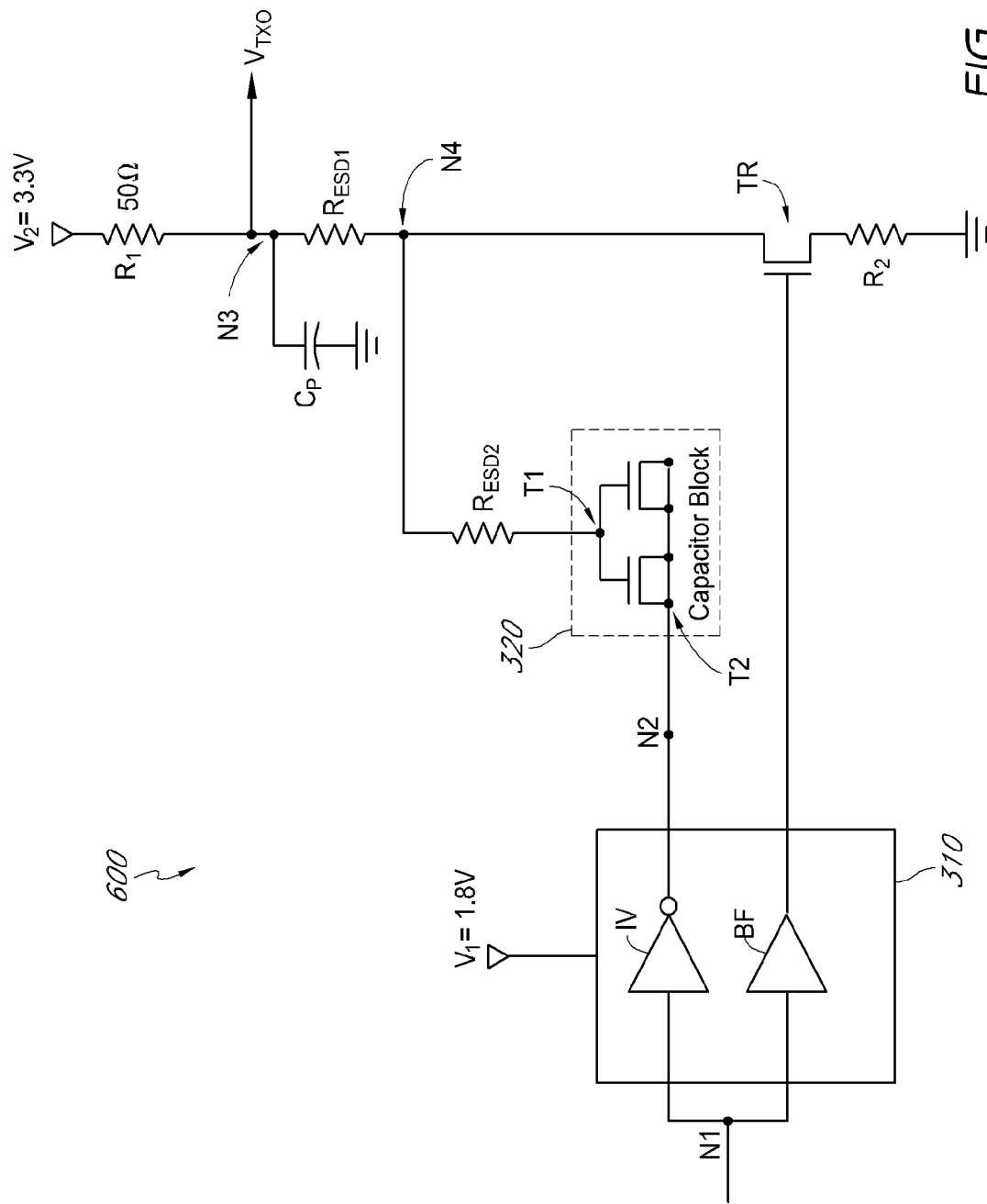

Referring to FIG. 6, another embodiment of driver circuit for a high frequency transmitter will be described. The illustrated driver circuit 600 can form at least part of any of the first to third driver circuits 260a-260c and the clock driver circuit 260d of FIG. 2. The driver circuit 600 can be used for an HDMI transmitter employing single-ended signaling. The driver circuit 600 includes a pre-amplifier 310, a capacitor block 320, a transistor TR, first and second resistors R1, R2, first and second electrostatic discharge (ESD) resistors $R_{ESD1}$, $R_{ESD2}$, a parasitic capacitor Cp, and first to fourth nodes N1-N4.

The pre-amplifier 310 includes an inverter IV and a buffer BF. Each of the inverter IV and the buffer BF includes an input coupled to an output of the encryptor 240 (FIG. 2) via the first node N1. The inverter IV also includes an output coupled to the second node N2. The buffer BF also includes an output coupled to the transistor TR. Other details of the pre-amplifier 310 can be as described above with respect to the pre-amplifier 310 of FIG. 3.

The capacitor block 320 includes a first terminal T1 coupled to a first end of the second ESD resistor $R_{ESD2}$, and a second terminal T2 coupled to the second node N2. In one embodiment, the capacitor block 320 can include a plurality of NMOS transistors coupled in parallel, as shown in FIG. 4C. In another embodiment, the capacitor block 320 can include one or more n-well capacitors, as shown in FIG. 4D. Other details of the capacitor block 320 can be as described above with respect to the capacitor blocks 320, 320c, 320d of FIGS. 3, 4C, and 4D.

The transistor TR is coupled between the fourth node N4 and the second resistor R2. The transistor TR has a source/drain coupled to the fourth node N4, a drain/source coupled to the second resistor R2, and a gate coupled to the output of the buffer BF. Other details of the transistor TR can be as described above with respect to the transistor TR of FIG. 3.

The first resistor R1 is coupled between a second voltage source V2 and the third node N3. The second resistor R2 is coupled between the drain/source of the transistor TR and ground. Other details of the first and second resistors R1, R2 can be as described above with respect to the first and second resistors R1, R2 of FIG. 3.

The first ESD resistor $R_{ESD1}$ is coupled between the third and fourth nodes N3, N4. The first ESD resistor $R_{ESD1}$ can have a resistance between about 0 ohms and about 50 ohms. The first ESD resistor $R_{ESD1}$ serves to protect the transistor TR from electrostatic discharge. In other embodiments, the first ESD resistor $R_{ESD1}$ can be coupled in parallel to one or more additional resistors.

The second ESD resistor $R_{ESD2}$ is coupled between the first terminal T1 of the capacitor block 320 and the fourth node N4. The second ESD resistor $R_{ESD2}$ can have a resistance between about 10 ohms and about 200 ohms. The second ESD resistor $R_{ESD2}$ serves to protect the capacitor block 320 from electrostatic discharge. In other embodiments, the second ESD resistor $R_{ESD2}$ can be coupled in parallel to one or more additional ESD resistors.

The parasitic capacitor Cp is an unavoidably formed capacitor between devices and interconnects of the circuit 600, as a result of the proximity of the devices and interconnects. In the illustrated embodiment, the parasitic capacitor Cp exists between the third node N3 and a DC reference, such as ground. The third node N3 is a node from which an output data signal $V_{TX0}$ is outputted to the connector 130 (FIG. 1). The operation of the driver circuit 600 can be as described above with respect to the operation of the driver circuit 300 in connection with FIGS. 3 and 5.

Figure 7:
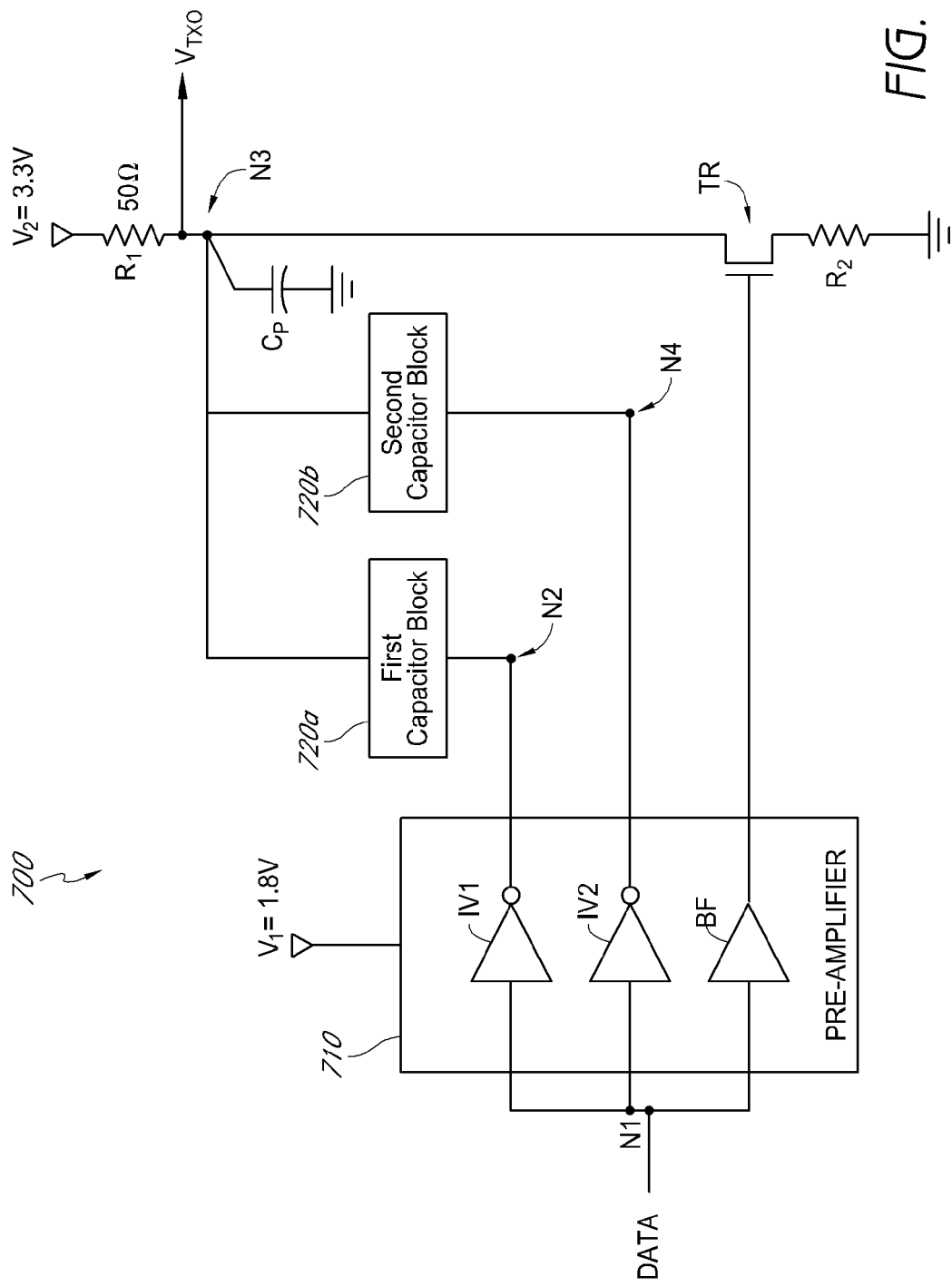

Referring to FIG. 7, yet another embodiment of driver circuit for a high frequency transmitter will be described below. The illustrated driver circuit 700 can form at least part of any of the first to third driver circuits 260a-260c and the clock driver circuit 260d of FIG. 2. The driver circuit 700 can be used for an HDMI transmitter employing single-ended signaling. The driver circuit 700 includes a pre-amplifier 710, first and second capacitor blocks 720a, 720b, a transistor TR, first and second resistors R1, R2, a parasitic capacitor Cp, and first to fourth nodes N1-N4.

The pre-amplifier 710 includes first and second inverters IV1, IV2 and a buffer BF. Each of the inverters IV1, IV2 and the buffer BF includes an input coupled to an output of the encryptor 240 (FIG. 2) via the first node N1. The first inverter IV1 also includes an output coupled to the second node N2. The second inverter IV2 also includes an output coupled to the fourth node N4. The buffer BF also includes an output coupled to the transistor TR. Other details of the pre-amplifier 710 can be as described above with respect to the pre-amplifier 310 of FIG. 3.

The first capacitor block 720*a* includes a first terminal coupled to the third node N3, and a second terminal coupled to the second node N2. The second capacitor block 720*b* includes a first terminal coupled to the third node N3, and a second terminal coupled to the fourth node N4. Each of the capacitor blocks 720*a*, 720*b* can include one or more of capacitors, PMOS or NMOS transistors, or n-well capacitors, as described earlier in connection with FIGS. 4A-4C. In certain embodiments, the capacitor blocks 720*a*, 720*b* can have different configurations from each other. Other details of the capacitor blocks 720*a*, 720*b* can be as described above with respect to the capacitor block 320, 320*a*-320*d* of FIGS. 3 and 4A-4D.

Details of the transistor TR, the first and second resistors R1, R2, and the parasitic capacitor Cp can be as described above with respect to the transistor TR, the first and second resistors R1, R2, and the parasitic capacitor Cp of FIG. 3. The operation of the driver circuit 700 can be as described above with respect to the operation of the driver circuit 300 in connection with FIGS. 3 and 5 except that the first and second capacitor blocks 720*a*, 720*b* together inject charge into the parasitic capacitor Cp or pull charge from the parasitic capacitor Cp during transitions of the output signal.

In other embodiments, the driver circuit 700 can include one or more additional pairs of inverters and capacitor blocks that are coupled in parallel to the first and the second inverter/capacitor block pairs, IV1/720*a*, IV2/720*b*. During the design phase, the maximum possible charge injection is set by the expected worst case operating conditions. By adjusting the number of inverter/capacitor block pairs during operation in product (based on data rate, a specific board layout, chip process, temperature, supply voltage, etc.), the driver circuit 700 can have a selected amount of charge injected into or pulled from the parasitic capacitor Cp during transitions of the output data signal. The programmable charge injection feature allows the transmitter to have optimal operating characteristics for all conditions.

Figure 8:
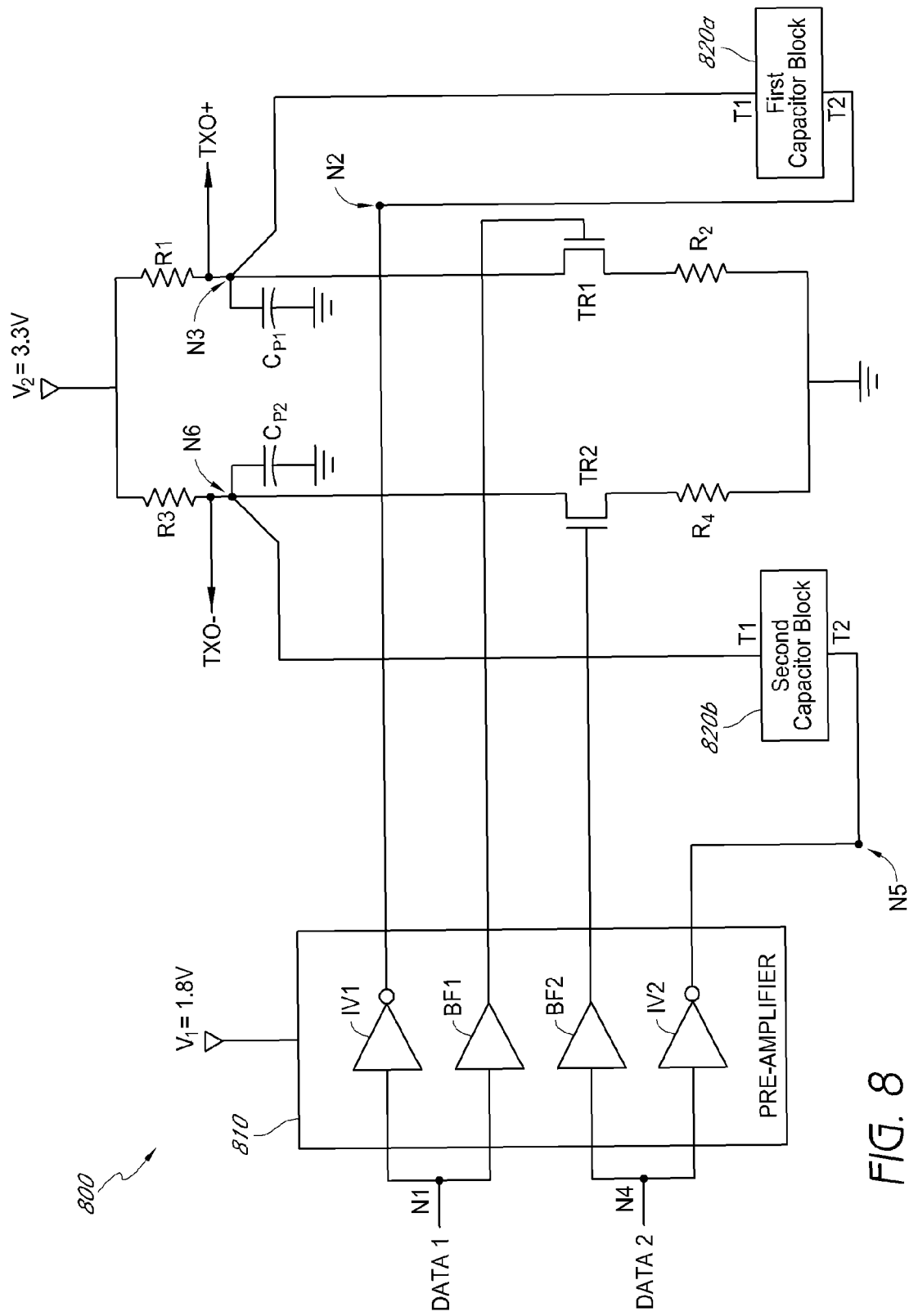

Referring to FIG. 8, yet another embodiment of a driver circuit for a high frequency transmitter will be described. The illustrated driver circuit 800 can form at least part of any of the first to third driver circuits 260*a*-260*c* and the clock driver circuit 260*d* of FIG. 2. The driver circuit 600 can be used for an HDMI transmitter employing differential signaling. The driver circuit 800 includes a pre-amplifier 810, first and second capacitor blocks 820*a*, 820*b*, first and second transistors TR1, TR2, first to fourth resistors R1-R4, first and second parasitic capacitors $C_{P1}$, $C_{P2}$, and first to sixth nodes N1-N6.

The pre-amplifier 810 includes first and second inverters IV1, IV2, and first and second buffers BF1, BF2. Each of the first inverter IV1 and the first buffer BF1 includes an input coupled to a first output of the encryptor 240 (FIG. 2) via the first node N1. The first inverter IV1 also includes an output coupled to the second node N2. The first buffer BF1 also includes an output coupled to the first transistor TR1.

Each of the second inverter IV2 and the second buffer BF1 includes an input coupled to a second output of the encryptor 240 (FIG. 2) via the fourth node N4. The second inverter IV1 also includes an output coupled to the fifth node N5. The second buffer BF1 also includes an output coupled to the second transistor TR2. Other details of the pre-amplifier 310 can be as described above with respect to the pre-amplifier 310 of FIG. 3.

The first capacitor block 820*a* includes a first terminal T1 coupled to the third node N3, and a second terminal T2 coupled to the second node N2. Other details of the first capacitor block 820*a* can be as described above with respect to the capacitor blocks 320, 320*a*-320*d* in connection with FIGS. 3 and 4A-4D.

The second capacitor block 820*b* includes a first terminal T1 coupled to the sixth node N6, and a second terminal T2 coupled to the fifth node N5. Other details of the second capacitor block 820*b* can be as described above with respect to the capacitor blocks 320, 320*a*-320*d* in connection with FIGS. 3 and 4A-4D.

The first transistor TR1 is coupled between the third node N3 and the second resistor R2. The first transistor TR1 has a source/drain coupled to the third node N3, a drain/source coupled to the second resistor R2, and a gate coupled to the output of the first buffer BF1. Other details of the first transistor TR1 can be as described above with respect to the transistor TR of FIG. 3.

The second transistor TR2 is coupled between the sixth node N6 and the fourth resistor R4. The second transistor TR2 has a source/drain coupled to the sixth node N6, a drain/source coupled to the fourth resistor R4, and a gate coupled to the output of the second buffer BF2. Other details of the second transistor TR2 can be as described above with respect to the transistor TR of FIG. 3.

The first resistor R1 is coupled between a second voltage source V2 and the third node N3. The second resistor R2 is coupled between the drain/source of the first transistor TR1 and a DC reference, such as ground. Other details of the first and second resistors R1, R2 can be as described above with respect to the first and second resistors R1, R2, respectively, of FIG. 3.

The third resistor R3 is coupled between the second voltage source V2 and the sixth node N6. The fourth resistor R4 is coupled between the drain/source of the second transistor TR2 and the DC reference. Other details of the third and fourth resistors R3, R4 can be as described above with respect to the first and second resistors R1, R2, respectively, of FIG. 3.

The first and second parasitic capacitors $C_{P1}$, $C_{P2}$ are unavoidably formed capacitors between devices and interconnects of the circuit 800, as a result of the proximity of the devices and interconnects. In the illustrated embodiment, the first parasitic capacitor $C_{P1}$ exists between the third node N3 and a DC reference, such as ground. The third node N3 is a node from which a non-inverted output data signal TX0+ is outputted to the connector 130 (FIG. 1).

The second parasitic capacitor $C_{P2}$ exists between the sixth node N6 and ground. The sixth node N6 is a node from which an inverted output data signal TX0− is outputted to the connector 130 (FIG. 1). The non-inverted and inverted signals TX0+, TX0− are complementary to each other, forming a differential signal. In other embodiments, the driver circuit 800 for differential signaling can employ other configurations and combinations of circuits, as described above in connection with FIGS. 6 and 7.

During operation, a first data signal DATA1 is provided to the first inverter IV1 and the first buffer BF1 via the first node N1. A second data signal DATA2, which is complementary to the first data signal DATA1, is provided to the second inverter IV2 and the second buffer BF2 via the fourth node N4. The first capacitor block 820*a*, the first transistor TR1, and the first parasitic capacitor $C_{P1}$ operate in the same manner as described above in connection with the timing diagram of FIG. 5. Thus, when the non-inverted signal TX0+ rises from low to high, the first capacitor block 820*a* injects charge into the first parasitic capacitor $C_{P1}$, thereby reducing the rise time of the non-inverted signal TX0+. In contrast, when the non-inverted signal TX0+ falls from high to low, the first capacitor block 820a pulls charge from the first parasitic capacitor $C_{P1}$, thereby reducing the fall time of the non-inverted signal TX0+.

The second capacitor block 820b, the second transistor TR2, and the second parasitic capacitor $C_{P2}$ operate in a manner complementary to the operation of the first capacitor block 820a, the first transistor TR1, and the first parasitic capacitor $C_{P1}$ due to the complementary nature of the second data signal DATA2. However, the second capacitor block 820b, the second transistor TR2, and the second parasitic capacitor $C_{P2}$ perform the same operation as that of the first capacitor block 820a, the first transistor TR1, and the first parasitic capacitor $C_{P1}$. Thus, when the inverted signal TX0− rises from low to high, the second capacitor block 820b injects charge into the second parasitic capacitor $C_{P2}$, thereby reducing rise time of the inverted signal TX0−. In contrast, when the inverted signal TX0− falls from high to low, the second capacitor block 820b pulls charge from the second parasitic capacitor $C_{P2}$, thereby reducing fall time of the inverted signal TX0−.

In the embodiments described above, one or more capacitor blocks inject charge into an associated parasitic capacitor when a data output signal rises, and pull charge from the parasitic capacitor when the data output signal falls. Thus, the capacitor blocks facilitate the charge and discharge of the parasitic capacitor which are driven by the voltage source and the transistor, respectively. Thus, the rise and fall time of the data output signal can be significantly reduced to a selected duration. In addition, the rise and fall time can be selected during design/production by the number or size of capacitor block(s) and inverter strength, thereby permitting flexibility in driver circuit design.

Applications

In the embodiments described above, the driver circuits were described in connection with an HDMI transmitter. A skilled artisan will, however, appreciate that the configurations and principles of the driver circuits can be adapted for any other high frequency transmitters. Examples of such transmitters include, but are not limited to, transmitters employing low voltage differential signaling (LVDS), positive emitter-coupled logic (PECL), low-voltage positive emitter-coupled logic (LVPECL), complementary metal-oxide-semiconductor (CMOS) logic, or High-Speed Transceiver Logic (HSTL).

Driver circuits employing the above described configurations can be implemented into various electronic devices or integrated circuits. Examples of the electronic devices can include, but are not limited to, consumer electronic products, parts of the consumer electronic products, electronic test equipments, etc. Examples of the electronic devices can also include memory chips, memory modules, circuits of optical networks or other communication networks, and disk driver circuits. The consumer electronic products can include, but are not limited to, a mobile phone, cellular base stations, a telephone, a television, a computer monitor, a computer, a hand-held computer, a personal digital assistant (PDA), a stereo system, a cassette recorder or player, a DVD player, a CD player, a VCR, an MP3 player, a radio, a camcorder, a camera, a digital camera, a portable memory chip, a copier, a facsimile machine, a scanner, a multi functional peripheral device, a wrist watch, a clock, etc. Further, the electronic device can include unfinished products.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An apparatus comprising:
   an input node;
   an output node;
   an explicit capacitor block having a first terminal coupled to the output node;
   a first switch operatively coupled to the output node, the first switch being capable of switching at least one of high or low in response to conditions at the input node; and
   an inverter or buffer circuit having an output capacitively coupled to the output node via the explicit capacitor block, wherein the output of the inverter or buffer circuit is configured to switch high and low in response to the conditions at the input node, wherein the output of the inverter or buffer circuit is substantially in phase with the output of the first switch,
   wherein the inverter or buffer circuit comprises an inverter or buffer having a first input and a first output, wherein the first input is electrically coupled to the input node, and wherein the first output is electrically coupled to the explicit capacitor block, and
   wherein the inverter or buffer circuit further comprises a buffer or inverter having a second input and a second output, wherein the second input is electrically coupled to the input node, and wherein the second output is configured to provide a signal to the first switch.

2. The apparatus of Claim 1, wherein the first switch comprises a transistor having a source/drain, a drain/source, and a gate, wherein the source/drain is electrically coupled to the output node, and wherein the gate is electrically coupled to the second output.

3. The apparatus of claim 2, wherein the explicit capacitor block comprises a first terminal electrically coupled to the output node, and a second terminal electrically coupled to the first output.

4. The apparatus of claim 3, wherein the inverter or buffer circuit is electrically coupled to a first voltage source configured to provide a first voltage, and
   wherein the apparatus further comprises a first resistor electrically coupled between a second voltage source and the output node, the second voltage source being configured to provide a second voltage higher than the first voltage.

5. The apparatus of claim 4, further comprising a second resistor electrically coupled between the first switch and a voltage reference.

6. The apparatus of claim 5, wherein the output node has a parasitic capacitor electrically coupled between the output node and a voltage reference.

7. The apparatus of claim 6, wherein the explicit capacitor block is configured to inject charge into the parasitic capacitor when the output signal rises, and wherein the explicit capacitor block is further configured to pull charge from the parasitic capacitor when the output signal falls.

8. The apparatus of claim 1, wherein the explicit capacitor block comprises a metal-insulator-metal capacitor.

9. The apparatus of claim 1, wherein the capacitor block comprises a metal-oxide-semiconductor (MOS) transistor having a source/drain, a drain/source, and a gate, and wherein the source/drain is electrically coupled to the drain/source.

10. The apparatus of claim 9, wherein the capacitor block further comprises one or more additional MOS transistors coupled in parallel to the MOS transistor.

11. The apparatus of claim 1, wherein the capacitor block comprises an n-well capacitor comprising a bulk region, a first n-well region, a second n-well region, a gate, and an insulating layer,
  wherein the first and second n-well regions are formed in the bulk region, laterally spaced apart from each other, and electrically coupled to each other,
  wherein the gate overlies a portion of the bulk region between the first and second n-well regions, and
  wherein the insulating layer is interposed between the gate and the portion of the bulk region.

12. The apparatus of claim 1, further comprising another explicit capacitor block electrically coupled between the inverter or buffer circuit and the output node.

13. The apparatus of claim 12, wherein the inverter or buffer circuit comprises a first inverter having a first inverter input and a first inverter output, and a second inverter having a second inverter input and a second inverter output,
  wherein the first and second inverter inputs are electrically coupled to the input node,
  wherein the first inverter output is electrically coupled to the explicit capacitor block, and
  wherein the second inverter output is electrically coupled to the other explicit capacitor block.

14. The apparatus of claim 1, wherein the output node is configured to output the output signal in compliance with the High Definition Multimedia Interface (HDMI) standard.

15. An apparatus comprising:
  an input node;
  an output node;
  an explicit capacitor block having a first terminal coupled to the output node;
  a first switch operatively coupled to the output node, the first switch being capable of switching at least one of high or low in response to conditions at the input node;
  an inverter or buffer circuit having an output capacitively coupled to the output node via the explicit capacitor block, wherein the output of the inverter or buffer circuit is configured to switch high and low in response to the conditions at the input node, wherein the output of the inverter or buffer circuit is substantially in phase with the output of the first switch;
  a first electrostatic discharge protection (ESD) resistor having a first end and a second end; and
  a second electrostatic discharge protection (ESD) resistor having a first end and a second end;
  wherein the output node is electrically coupled to the first switch via the first ESD resistor such that the first end of the first ESD resistor is coupled to the output node, and such that the second end of the first ESD resistor is coupled to the first switch;
  wherein the explicit capacitor block is electrically coupled to the first switch via the second ESD resistor such that the first end of the second ESD resistor is electrically coupled to the second end of the first ESD resistor, and such that the second end of the second ESD resistor is coupled to the explicit capacitor block.

16. The device of claim 15, wherein the inverter or buffer circuit comprises an inverter or buffer having a first input and a first output, wherein the first input is electrically coupled to the input node, and wherein the first output is electrically coupled to the explicit capacitor block.

17. The device of claim 16, wherein the inverter or buffer circuit further comprises a buffer or inverter having a second input and a second output, wherein the second input is electrically coupled to the input node, and wherein the second output is configured to provide a signal to the first switch.

18. The apparatus of claim 15, wherein the first switch comprises a transistor having a source/drain, a drain/source, and a gate, wherein the source/drain is electrically coupled to the output node, and wherein the gate is electrically coupled to the second output.

19. The apparatus of claim 18, wherein the explicit capacitor block comprises a first terminal electrically coupled to the output node, and a second terminal electrically coupled to the first output.

20. The apparatus of claim 19, wherein the inverter or buffer circuit is electrically coupled to a first voltage source configured to provide a first voltage, and
  wherein the apparatus further comprises a first resistor electrically coupled between a second voltage source and the output node, the second voltage source being configured to provide a second voltage higher than the first voltage.

21. The apparatus of claim 20, further comprising a second resistor electrically coupled between the first switch and a voltage reference.

22. The apparatus of claim 21, wherein the output node has a parasitic capacitor electrically coupled between the output node and a voltage reference.

23. The apparatus of claim 22, wherein the explicit capacitor block is configured to inject charge into the parasitic capacitor when the output signal rises, and wherein the explicit capacitor block is further configured to pull charge from the parasitic capacitor when the output signal falls.

24. The apparatus of claim 15, wherein the explicit capacitor block comprises a metal-insulator-metal capacitor.

25. An apparatus comprising:
  an input node;
  an output node;
  an explicit capacitor block having a first terminal coupled to the output node;
  a first switch operatively coupled to the output node, the first switch being capable of switching at least one of high or low in response to conditions at the input node;
  an inverter or buffer circuit having an output capacitively coupled to the output node via the explicit capacitor block, wherein the output of the inverter or buffer circuit is configured to switch high and low in response to the conditions at the input node, wherein the output of the inverter or buffer circuit is substantially in phase with the output of the first switch;
  another input node;
  another output node;
  another explicit capacitor block having a first terminal coupled to the other output node; and
  a second switch operatively coupled to the other output node, the second switch being capable of switching at least one of high or low in response to conditions at the other input node,
  wherein the inverter or buffer circuit includes another output capacitively coupled to the other output node via the other explicit capacitor block, wherein the other output of the inverter or buffer circuit is configured to switch high and low in response to the conditions at the other input node, wherein the other output of the inverter or buffer circuit is substantially in phase with the output of the second switch.

26. An electronic device comprising:
  a driver circuit coupled between an input node and an output node, the driver circuit comprising:

an inverter having an inverter input and an inverter output, the inverter input being configured to receive a data or clock signal via the input node;

a buffer having a buffer input and a buffer output, the buffer input being configured to receive the data or clock signal via the input node;

a capacitor block having a first terminal and a second terminal, the first terminal being electrically coupled to the output node, the second terminal being electrically coupled to the inverter output;

a parasitic capacitor coupled between the output node and ground; and a transistor electrically coupled between the output node and a voltage reference, the transistor being configured to receive a signal from the buffer output.

27. The device of claim 26, further comprising a resistor coupled between a voltage source and the output node.

* * * * *